United States Patent [19]

Bixby

[11] Patent Number: 4,658,240

[45] Date of Patent: Apr. 14, 1987

[54] APPARATUS FOR CONVERTING DATA BETWEEN ANALOG AND DIGITAL VALUES

[75] Inventor: James A. Bixby, San Diego, Calif.

[73] Assignee: Brooktree Corporation, San Diego, Calif.

[21] Appl. No.: 607,736

[22] Filed: May 7, 1984

[51] Int. Cl.$^4$ .......................................... H03K 13/02
[52] U.S. Cl. ........................ 340/347 AD; 340/347 M; 340/347 DA
[58] Field of Search ................ 340/347 AD, 347 DA, 340/347 M

[56] References Cited

U.S. PATENT DOCUMENTS

| | | | |
|---|---|---|---|
| 3,477,031 | 9/1967 | Nagata | 357/41 X |
| 3,747,088 | 7/1973 | Pastoriza | 340/347 DA |
| 3,995,304 | 11/1976 | Pease | 340/347 DA X |
| 4,146,882 | 3/1979 | Hoff, Jr. et al. | 340/347 DA |
| 4,336,528 | 6/1982 | Kane | 340/347 DA |
| 4,366,470 | 12/1982 | Takanashi et al. | 340/347 DA |
| 4,482,887 | 11/1984 | Crauwels | 340/347 DA |

FOREIGN PATENT DOCUMENTS

| | | | |
|---|---|---|---|
| 0095674 | 12/1983 | European Pat. Off. | 340/347 DA |
| 2417893 | 10/1978 | France | 340/347 DA |

OTHER PUBLICATIONS

Maddox, Ed, "Current-Steering Chip Upgrades Performance of D-A Converter", Electronics, Apr. 4, 1974, pp. 125–130.

Primary Examiner—William M. Shoop, Jr.
Assistant Examiner—Sharon D. Logan
Attorney, Agent, or Firm—Ellsworth R. Roston; Charles H. Schwartz

[57] ABSTRACT

Signals representing individual digital values are introduced to pluralities of switches of corresponding digital significance to provide for the conductivity of an individual one of the switches in each pair in accordance with the digital value represented by such signals. A plurality of conductive output members to provide paths through a matrix relationship of the switches and through the output members to one of two output lines. This matrix provides for progressive increases in the number of the output members connected to a particular one of the output lines with progressive increases in the digital value and for a continued connection to the particular output line of output members previously connected to the particular output line with such progressive increases in the digital value. The cumulative current through the particular output line is indicative of the analog value. The output members are disposed on an integrated circuit chip in groups each having a common centroid arrangement to offset correlated errors in the output members in the group. The members in each group may be disposed in pairs relative to the common centroid to provide offsets in the correlated errors in the output members in each pair. The output members in the groups having intermediate digital values in the range of digital values may be disposed relative to the common centroid in positions providing minimum correlation errors. Coincidentally, the output members in groups having extreme digital values in the range of digital values may be disposed relative to the common centroid in positions providing increased correlation errors.

30 Claims, 6 Drawing Figures

| "1" | "2" | "4" | 90 | 91 X | | | | | | I |
|---|---|---|---|---|---|---|---|---|---|---|
| 0 | 0 | 0 | H | D | F | B | G | C | E | H |
| 1 | 0 | 0 | H | D | F | B | G | C | E | D |
| 0 | 1 | 0 | H | D | F | B | G | C | E | F |
| 1 | 1 | 0 | H | D | F | B | G | C | E | B |
| 0 | 0 | 1 | H | D | F | B | G | C | E | G |
| 1 | 0 | 1 | H | D | F | B | G | C | E | C |
| 0 | 1 | 1 | H | D | F | B | G | C | E | E |
| 1 | 1 | 1 | H | D | F | B | G | C | E | A |

O

RELATIVE DIGITAL SIGNIFICANCE OF OUTPUT MEMBERS

| COLUMN | 1 | 2 | 3 | 4 | 5 | 6 | 7 | 8 |
|---|---|---|---|---|---|---|---|---|
| ROWS | | | | | | | | |
| 1 | 0 | 60 | 4 | 48 | 50 | 6 | 62 | 2 |
| 2 | 52 | 44 | 12 | 24 | 26 | 24 | 46 | 54 |
| 3 | 8 | 16 | 20 | 36 | 38 | 22 | 18 | 10 |
| 4 | 56 | 40 | 28 | 32 | 34 | 30 | 42 | 58 |
| 5 | 59 | 43 | 31 | 35 | 33 | 29 | 41 | 57 |
| 6 | 11 | 19 | 23 | 39 | 37 | 21 | 17 | 9 |
| 7 | 55 | 47 | 15 | 27 | 25 | 13 | 45 | 53 |
| 8 | 3 | 63 | 7 | 51 | 49 | 5 | 61 | 1 |

APPARATUS FOR CONVERTING DATA BETWEEN ANALOG AND DIGITAL VALUES

This invention relates to apparatus for converting data between a digital form and an analog form. More particularly, the invention relates to apparatus which provides such conversion instantaneously and on a monotonic basis and in a simple and reliable manner. The invention further relates to apparatus for providing such conversion with minimal errors.

Various types of equipment receive information in analog form. Such equipment includes process control equipment, measuring instruments, communication equipment and a wide variety of other equipment. Digital computers and data processing systems often receive input parameters in analog form from such equipment and convert these parameters to digital form for processing in the computer or the data processing equipment. After the analog information has been converted to digital information and has been processed, the output information from the digital computer or the data processing equipment is often converted to analog form. By converting the digital information to analog form, the user can assimilate the information in ways which would be difficult if the information remained in digital form.

A good example of the conversions discussed in the previous paragraph is in the recording and reproduction of music. The music is produced in analog form. It is converted to digital form by recently developed data processing techniques and is recorded on a medium such as a tape or a disc. When the music is to be reproduced, it is converted again to analog form because this is the form which is necessary to operate sound transducers to give meaning to the listener when he hears the music.

As digital computers and data processing equipment have become widespread throughout industry and the office and have even become common in the home, the need for inexpensive, simple and reliable apparatus for converting information between analog and digital forms has become of increasing concern. A considerable effort has been devoted over a period of several decades to provide for converting apparatus which is simple, inexpensive and reliable. In spite of such efforts, the converting apparatus now in use does not meet such criteria.

The converting apparatus now in use also has other problems of long-standing. For example, the converting apparatus now in use may not be monotonic unless it is quite expensive and complex. By "monotonic" is meant that digital information of progressively increasing value is converted to analog information of progressively increasing value without any decrease in the analog value as the digital value progressively increases. The converting apparatus now in use also has relatively high differential and integral non-linearities unless the apparatus is quite expensive and complex. Integral non-linearities result from errors produced in a conversion between analog and digital values over a wide range of such values. Differential non-linearities result from errors produced in a conversion between analog and digital values over a relatively narrow range of such values.

The converting apparatus now in general use also has another problem of major proportions. This results when particular digital values are increased incrementally by a single digit. For example, problems in the converters now in binary representation of "511" is converted to a binary representation of "512". This results from the fact that the binary representation of "511" is represented by a value of 0111111111 and a binary representation of "512" is represented by 1000000000 where the least significant digit is at the right. As will be seen, the value of each binary digit changes when the decimal value changes from "511" to "512". As the binary values change from 0111111111 to 1000000000, discontinuities may occur because there is a change between a binary value of "0" and a binary value of "1" at each digital position. These discontinuities may prevent the converter from being truly monotonic. This problem even exists in converters which are made quite complex in an attempt to overcome the problem.

In copending application Ser. No. 302,841 filed by Henry S. Katzenstein and Herbert Sullivan on Sept. 16, 1981, for "Apparatus for Providing a Conversion Between Digital and Analog Values" and assigned of record to the assignee of record of this application, apparatus is disclosed and claimed for converting between analog and digital values on a monotonic basis. Such apparatus is simple and inexpensive and reliable. It is able to operate with a high precision at high levels of power. As a result, the converting apparatus is capable of being used in areas not available for the converters of the prior art. For example, such apparatus is able to convert oral information in analog form by serving both as a converter and an amplifier.

The apparatus disclosed and claimed in application Ser. No. 302,841 also has other advantages of some importance. For example, it provides analog values of progressively increasing value as the digital value to be converted increases. It provides low differential and integral non-linearities. It is also free of the effects of aging and changes in temperature. It also provides accurate and reliable conversions between analog and digital values at high frequencies with minimal error.

Copending application Ser. No. 383,544 filed on June 1, 1982, by Henry S. Katzenstein for "Apparatus For Converting Between Analog and Digital Values" and assigned of record of this application discloses and claims a converter which has all of the advantages described above. The converter of application Ser. No. 383,544 also has other advantages of some importance. For example, the converter is able to provide an instantaneous conversion between analog and digital values, and it provides a monotonic operation with minimal integral and differential non-linearities. The converter is also quite simple in construction and is reliable in operation.

In the embodiment of the invention disclosed and claimed in application Ser. No. 383,544, apparatus is provided for converting between analog and digital values. The apparatus includes means for providing a plurality of signals representing the digital values. Pluralities of control switches are also provided, the number of control switches in each plurality being directly related to the digital significance of the control switches in such plurality. The control switches may be paired to provide for a conductivity of one switch in each pair. The signals representing individual digital values are introduced to the pluralities of control switches of corresponding digital significance to provide for the conductivity of an individual one of the control switches in each pair in accordance with the digital value represented by the signals introduced to the control switches in such pair.

A plurality of output members are also provided in the system of application Ser. No. 383,544. The output members and the pluralities of control switches are connected in a particular matrix relationship to provide paths through the conductive ones of the control switches. Since the output members are conductive, the control switches operate to introduce the current through the output members to one of two output lines. This provides for progressive increases in the number of the output members connected to a particular one of the output lines with progressive increases in the digital value and for a connection to the particular output line of the output members previously connected to the particular output line with progressive increases in the digital value. The cumulative current through the output members connected to the particular output line is indicative of the analog value.

Additional means may be connected in the system of application Ser. No. 383,544 to provide an indication of the digital values of reduced digital significance relative to the digital significance of the pluralities of control switches. An interpolation line may be connected to the particular matrix relationship to receive a current from the output member to be connected next to the particular output line for increasing digital values. The interpolation line and the additional means and the means providing the digital values of reduced digital significance may be connected to provide a current from the additional means in accordance with the value of the digits of reduced digital significance and for introducing such current to the particular output line to provide an output current on the particular output line in representation of the analog value. The additional means may constitute another one of the particular matrix relationships.

When the different output members of application Ser. No. 383,544 are disposed on an integrated circuit chip, the characteristics of the different output members tend to vary progressively across the chip. These progressive errors may result, by way of example, from temperature gradients, linear or quasi-linear variations in geometric line widths and layer thicknesses and doping and impurity gradients. These progressive errors may be considered as "correlated errors" since they are correlated to the position of each output member on the integrated circuit chip.

"Correlated errors" may be distinguished from "uncorrelated errors", which may be considered as random. Examples of uncorrelated errors are those resulting from grain size of the material used to define the output members on the integrated circuit chip, grain size of the photolithic plates and photoresist used to form the integrated circuit chips, microscopic defects and surface roughness and irregularities.

This invention provides for the positioning of the output members on the integrated circuit chip in the system of application Ser. No. 383,544 to minimize correlated errors. In this positioning, the output members are disposed on an integrated circuit chip in groups each having a common centroid arrangement to offset correlated errors in the output members in the group. The output members in each group may be disposed in pairs relative to the common centroid to provide offsets in the correlated errors in the output members in each pair. The output members in the groups having intermediate digital values in the range of digital values may be disposed relative to the common centroid in positions providing minimum correlated errors. Coincidentally, the output members in groups having extreme digital values in the range of digital values may be disposed relative to the common centroid in positions providing increased correlation errors.

Figures 1, 2:
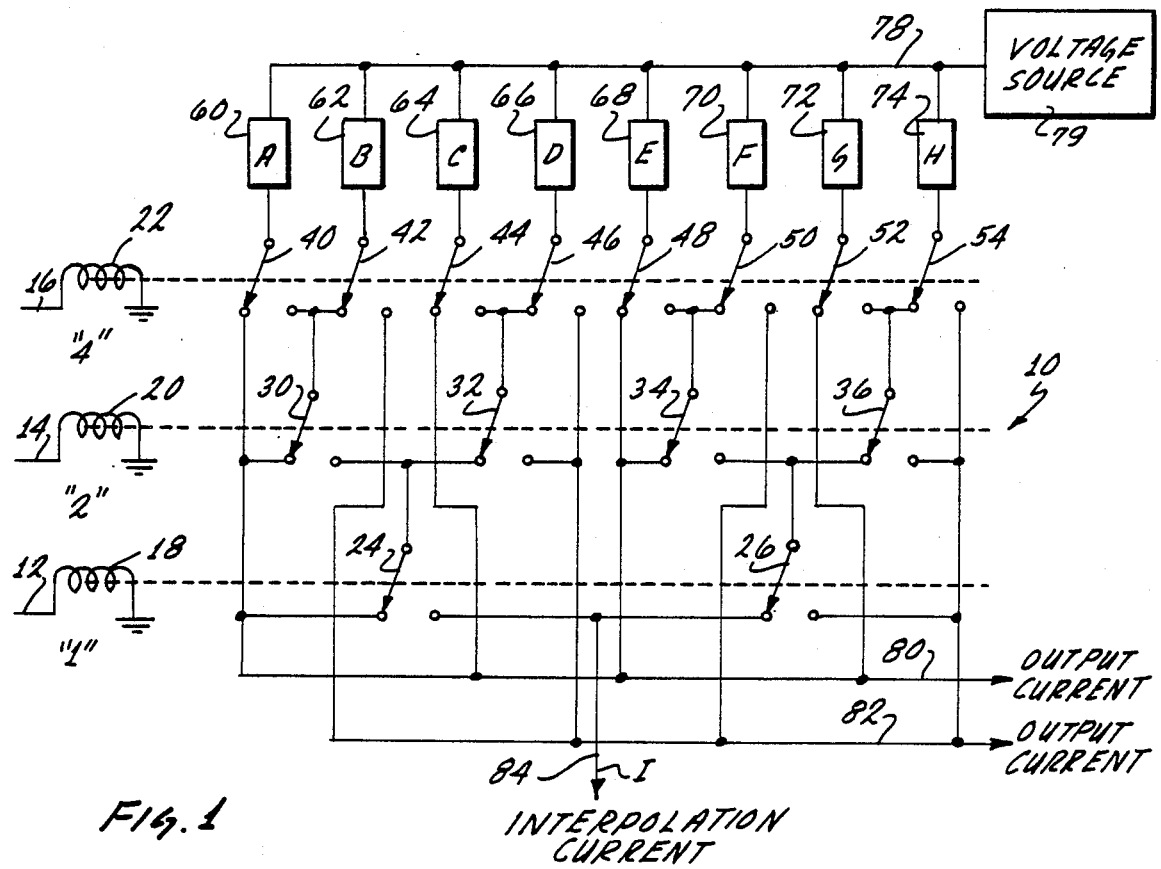
FIG. 1 is a schematic circuit diagram of one embodiment of the invention, this embodiment employing magnetic relays and switches as control elements.
FIG. 2 is a truth table illustrating the operation of the system shown in FIG. 1.

In the embodiment of the invention shown in FIG. 1, a digital-to-analog converter generally indicated at 10 is provided. The converter 10 receives digital signals on a plurality of input lines 12, 14 and 16. The signals on the lines preferably represent information in binary form. For example, the signals on the line 12 may represent a binary value of "1" and the signal on the lines 14 and 16 may respectively represent binary values of "$2^1$" and "$2^2$". Illustratively, a binary "1" may be represented by a signal of high amplitude and a binary "0" may be represented by a signal of low amplitude. Although only three (3) digits are shown, it will be appreciated that any particular number of digits may be used.

Actuating means such as solenoids may be associated with each of the lines 12, 14 and 16. The solenoids respectively associated with the lines 12, 14 and 16 are designated as 18, 20 and 22. Control switches 24 and 26 are respectively associated with the solenoid 18. Control switches 30, 32, 34 and 36 are respectively associated with the solenoid 20 and control switches 40, 42, 44, 46, 48, 50 and 52 are associated with the solenoid 22. Each of the control switches is provided with a movable arm which is moved from the left stationary contact to the right stationary contact in FIG. 1 when the associated solenoid is energized.

As will be appreciated, the solenoids 18, 20 and 22 and the switches 24 through 54 (even numbers only) may be considered to be representative of different types of arrangements which can be used. The switches may be electromagnetic as shown in FIG. 1 or may constitute any other type of arrangement for providing one state of operation when the digit controlling the operation of the switch has a binary value of "1" and for providing another state of operation when the digit controlling the operation of the switch has a binary value of "0". As will be seen, for example, from the embodiment shown in FIG. 3, the switches may be replaced by pairs of transistors.

A plurality of output members 60, 62, 64, 66, 68, 70, 72 and 74 are also provided in the embodiment of FIG. 1. Each of the output members is constructed to provide an output having the same characteristics as the output provided by the other members. For example, the output members 60 through 74 (even numbers only) may constitute current sources which provide substantially equal currents when energized.

The control switches 24 through 54 (even numbers only) are connected in a particular matrix arrangement with the output members 60 through 74. In this matrix arrangement, the movable arms of the control switches 40 through 54 (even numbers only) are respectively connected to the output members 60 through 74 (even numbers only), each of which receives an input voltage on a line 78 from a source 79. The switchess 24 and 26 may be considered as one sub-set; the switches 30, 32, 34 and 36 may be considered as a second sub-set; and the switches 40 through 54 (even numbers only) may be considered as a third sub-set. All of the switches may be considered to constitute a plurality. The matrix relationship defined by the control switches 24 through 54 (even numbers only) may be considered to be disposed in the form of an electrical pyramid since the number of switches in each sub-set increases for the digits of progressively increasing significance.

The control switches 24 through 54 (even numbers only) are connected in a recursive relationship. This results from the fact that the switches are connected in repetitions of a basic block. This block may be considered to constitute the switches 24 and 26 and the switches 30, 32, 34 and 36. The switches 30, 32, 34 and 36 and the switches 40 through 54 Ieven numbers only) may be considered to constitute a second block. The recursive relationship defined by the switches 24 and 26 the swtiches 30, 32, 34 and 36 may be considered as being divided into two (2) recursive sub-relationships, one (1) recursive sub-relationship being provided by the switches 24, 30 and 32 and the other being provided by the switchs 26, 34 and 36. Similarly, each of the switches 30, 32, 34 and 36 may be respectively considered to be connected in sub-blocks with the switches 40 and 42, the switches 44 and 46, the switches 48 and 50 and the switches 52 and 54.

As will be seen, the control switches 24 through 54 (even numbers only) are connected in a matrix relationship to one another and to the output members 60 through 74 (even numbers only) to avoid any cross-over of leads connecting the control switches and the output members. This is important in minimizing capacitive effects in the matrix arrangement. Such capacitive effects are undesirable since they would otherwise tend to limit the maximum frequency at which the system of FIG. 1 can operate.

The left stationary contacts of the switches 40, 44, 48 and 52 are connected to an output line 80 and the right stationary contacts of the switches 42, 46, 50 and 54 are connected to an output line 82. Connections are made from the right contact of the switch 40 and the left contact of the switch 42 to the movable arm of the switch 30, from the right contact of the switch 44 and the left contact of the switch 46 to the movable arm of the switch 32, from the right contact of the switch 48 and the left contact of the switch 50 to the movable arm of the switch 34 and from the right contact of the switch 52 and the left contact of the switch 54 to the movable arm of the switch 36.

The left stationary contacts of the switches 30 and 34 are connected to the output line 80, and the right stationary contacts of the switches 32 and 36 are connected to the output line 82. The right stationary contact of the switch 30 and the left stationary contact of the switch 32 are common with the movable arm of the switch 24 and the right stationary contact of the switch 34 and the left stationary contact of the switch 36 are common with the movable arm of the switch 26. The left stationary contact of the switch 24 is connected to the output line 80 and the right stationary contact of the switch 26 is connected to the output line 82. The right stationary contact of the switch 24 and the left stationary contact of the switch 26 are common with an interpolation line 84.

FIG. 2 provides a table indicating the states of operation of the output members 60 through 74 (even numbers only) for different digital values represented by the signals on the lines 12, 14 and 16. As will be seen, the first three columns of FIG. 2 respectively represent the binary values of the signals on the lines 12, 14 and 16. These binary values correspond in successive rows to analog values between "0" and "7". For example, in the third row, a value of "010" indicates an analog value of "2" and, in the sixth row, a digital representation of "101" represents an analog value of "5".

The next seven (7) columns represent the states of connection of the output members 60 through 74 (even numbers only) for the different digital values. These states of conductivity are represented by the letters "A" through "H" which respectively correspond to the output members 60 through 74 (even numbers only). The letters "A" through "H" are shown in FIG. 1 within the blocks respectively representing the output members 60 through 74 (even numbers only).

Diagonal lines 90 and 91 are shown in FIG. 2. These diagonal lines delineate the conductive ones of the output members connected to the output line 82 for the different values between "0" and "7" and the output members connected to the output line 80 for such values. The indications to the left of the diagonal line 90 represent the output members connected to the output line 82 and the indications to the right of the diagonal line 91 represent the output members connected to the output line 80. The output members between the lines 90 and 91 are connected to the interpolation line 84.

The number of output members to the left of the line 90 for any digital value corresponds to the digital value indicated in the first three columns. For example, for a digital value of "010" corresponding to an analog value of "2", the output members "H" and "D" are connected to the output line 82 so that the output line indicated an analog value of "2". Similarly, for a digital value of "101" corresponding to an analog value of "5", the output members "H", "D", "F", "B" and "G" are connected to the output line 82 so that the line 82 indicates the analog value of "5".

As will be further seen, the output members previously connected to the output line 82 for any digital value continue to remain connected to the output line 82 as the digital value increases. In this way, the output indication of the digital value is monotonic for any value of the count. Furthermore, by maintaining the characteristics of the output members 60 through 74 (even numbers only) substantially constant for the different output members, the circuit shown in FIG. 1 has low differential and integral non-linearities.

The operation of the circuitry shown in FIG. 1 may be seen by an analysis of specific digital values. For example, for a digital value of "010" corresponding to an analog value of "2", a digital value of "1" is produced on the line 14 to actuate the movable arms of the control switches 30, 32, 34 and 36 from the left stationary contacts to the right stationary contacts of the switches. This causes the output member 74 to be conductive through a circuit including the voltage source 79, the line 78, the output member 74, the movable arm and left stationary contact of the switch 54, the movable arm and right stationary contact of the switch 36 and the output line 82. Similarly, a circuit is established to the output line 82 through the output member 66. This circuit includes the voltage source 79, the line 78, the output member 66, the movable arm and left stationary contact of the switch 46, the movable arm and right stationary contact of the switch 32 and the line 82.

The movable arms of the switches 24 and 26 and of the switches 40, 42, 44, 46, 48, 50, 52 and 54 are actuated from the left stationary contacts to the right stationary contacts of the switches when the digital value is "101" representing an analog value of "5". When these switches are actuated, the output member 74 is energized through a circuit including the voltage source 79, the output member 74, the switch 54 and the output line 82; the output member 66 is energized through a circuit including the voltage source 79, the output member 66, the switch 46 and the output line 82; the output member 70 is energized through a circuit including the voltage source 79, the output member 70, the switch 50 and the output line 82; and the output member 62 is energized through a circuit including the voltage source, the output member, the switch 42 and the output line 82. The output member 72 is energized through a circuit including the output member, the switch 52, the switch 36, the switch 26 and the output line 82.

The last column of FIG. 2 indicates the particular one of the output members 60 through 74 (even numbers only) to be connected to the interpolation line 84 for any particular digital value. For example, the F output member is indicated in the last column of FIG. 2 as being the particular output member which is connected to the interpolation line 84. As will be seen, this output member then is connected to the output line 82 when the analog value advances from "2" to "3". For an analog value of "2", the output of the F output member is introduced to the interpolation line 84 through a circuit including the voltage source 79, the F output member 70, the movable arm and left stationary contact of the switch 50, the movable arm and right stationary contact of the switch 34, the movable arm and left stationary contact of the switch 26 and the interpolation line 84. In a sense, the connection of individual ones of the output members 60 through 74 (even numbers only) to the interpolation line 84 at different instants indicates the digital value being converted at such instants. The interpolation line 84 also has other important utilities, as will be seen from a subsequent discussion of the embodiment shown in FIG. 4.

Figure 3:
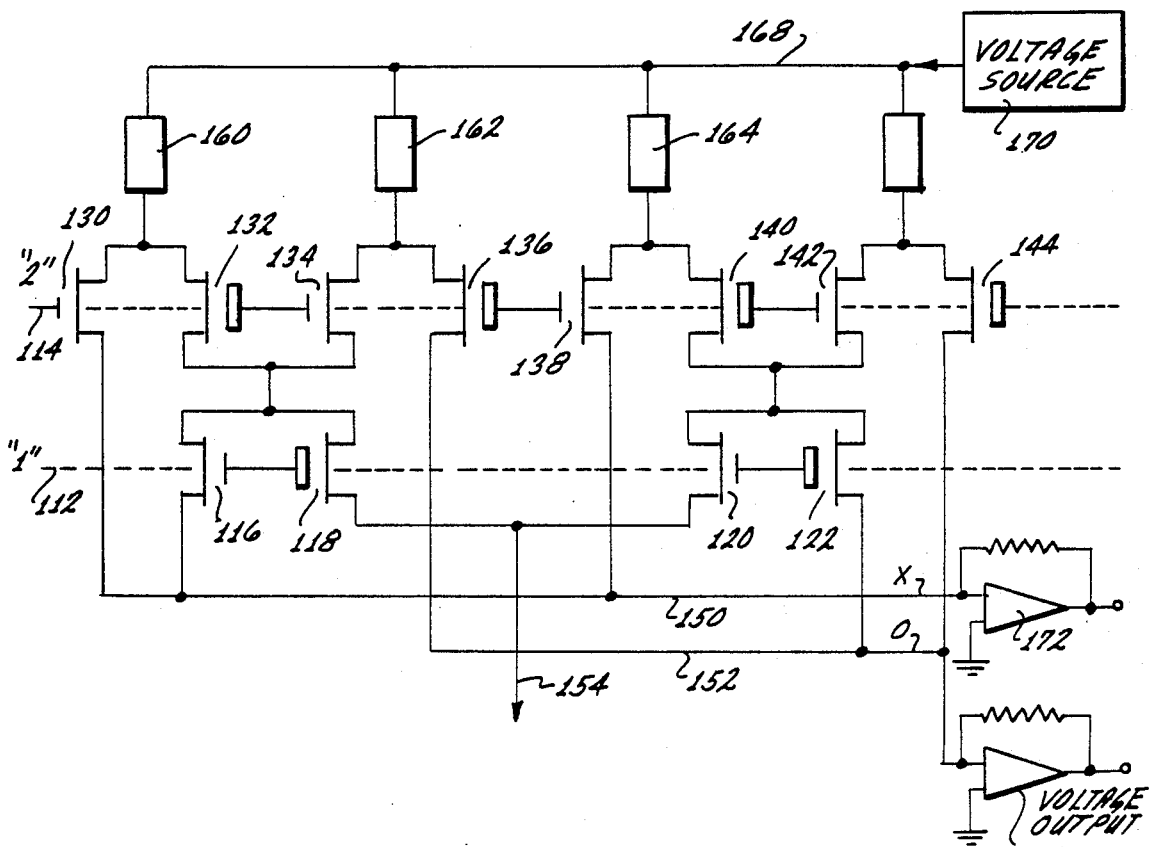
FIG. 3 is a schematic circuit diagram of another embodiment of the invention, this embodiment employing transistors as control elements.

FIG. 3 shows an arrangement substantially similar in concept to that of FIG. 1 except that the control switches of FIG. 1 are replaced by solid state members or elements such as control transistors in FIG. 3. In view of this, FIG. 3 is simplified from FIG. 1 so that only the operation of the circuit for the digital values $2^0=1$ and $2^1=2$ is shown. The digital values $2^0$ and $2^1$ are respectively provided on lines 112 and 114. The line 112 is connected to the bases of transistors 116, 118, 120 and 122. The transistors 116, 118, 120 and 122 may constitute field effect transistors, particularly MOS field effect transistors, or may constitute any other suitable type of control transistor. The transistors 116 and 120 may particularly comprise N-channel field effect transistors and the transistors 118 and 122 may comprise P-channel field effect transistors.

Similarly, the line 114 is connected to the bases of transistors 130, 132, 134, 136, 138, 140, 142 and 144. As with the transistors 116, 118, 120 and 122, the transistors 130 through 144 (even numbers only) may constitute field effect transistors or any other suitable type of transistor. When field effect transistors are used, the transistors 130, 134, 138 and 142 may constitute N-channel field effect transistors and the transistors 132, 136, 140 and 144 may constitute P-channel effect transistors.

The sources of the N-channel transistors 116, 130 and 138 are connected to an output line 150 and the sources of the P-channel transistors 122, 136 and 144 are connected to an output line 152. A connection is made from the source of the P-channel field effect transistor 118 and the N-channel field effect transistor 120 to an interpolation line 154. The drains of the transistors 116 and 118 are common with the sources of the transistors 132 and 134. Similarly, the drains of the transistors 120 and 122 and the sources of the transistors 140 and 142 have a common terminal.

Connections are made from the drains of the transistors 130 and 132 to an output member 160, from the drains of the transistors 134 and 136 to an output member 162, from the drains of the transistors 138 and 140 to an output member 164 and from the drains of the transistors 142 and 144 to an output member 166. The output members are connected through a line 168 to a voltage source 170. The output members 160, 162, 164 and 166 may constitute transistors which provide a relatively large and substantially constant current when conductive. For example, the members 160, 162, 164 and 166 may constitute C-MOS transistors.

The N-channel field effect transistors such as the transistor 116 are non-conductive when a signal having a relatively low voltage and representing a digital value of "0" are introduced to the bases of the transistors. The N-channel field effect transistors such as the transistor 116 become conductive when a positive voltage representing a digital value of "1" is introduced to the bases of the transistors. In constrast, the P-channel field effect transistors such as the transistor 118 are non-conductive when a positive voltage is introduced to the base of the transistor in representation of a digital value of "1". The P-channel field effect transistors such as the transistor 118 become conductive when a negative voltage representing a digital value of "0" is introduced to the bases of the transistors.

The circuit shown in FIG. 3 and described above operates in a manner similar to the circuit shown in FIG. 1. This may be seen from the fact that each pair of transistors corresponds to one of the switches shown in FIG. 1. For example, a state of conduction in the transistor 116 in FIG. 3 corresponds to the disposition of the movable arm of the switch 24 against the right stationary contact of the switch in FIG. 1. Similarly, a state of conductivity in the transistor 118 in FIG. 3 corresponds to an engagement between the movable arm and the left stationary contact of the switch 24 in FIG. 1.

The operation of the circuit of FIG. 3 may be seen from specific examples. For example, for an analog value of "1" represented by a digital "1" on the line 112 and a digital "0" on the line 114, the transistors 116 and 120 become conductive and the transistors 132, 136, 140 and 144 are conductive. This causes current to flow through a circuit including the voltage source 170, the output member 160, the transistor 132 and the transistor 116 to the output line 150 to indicate an analog value of "1". At the same time, current flows through a circuit including the voltage source 170, the output member 164, the transistor 140, the transistor 120 and the interpolation line 154. The currents through the output members 162 and 166 are introduced to the line 152. Since only the current in the line 150 is effective in indicating the analog value represented by the digital signals, an analog value of "1" is indicated by the current on the line 150.

An amplifier 172 is connected to the line 150 to receive the current through the line and to provide a proper load to the matrix arrangement shown in FIG. 3. The amplifier 172 converts the current in the line 150 to a voltage proportional to this current. Amplifiers corresponding to the amplifier 172 are well known in the art. Similarly, an amplifier 176 is connected to the line 152 to present an appropriate load to the line 152.

The transistors 130, 134, 138 and 142 become conductive and the transistors 118 and 122 become conductive for an analog value of "2". When this occurs, the output member 160 passes a signal to the line 150 through the transistor 130 and the output member 164 passes current to the line 150 through the transistor 138. The transistor 162 passes current to the interpolation line 154 through a circuit including the voltage source 170, the output member 162, the transistor 134, the transistor 118 and the interpolation line. The output member 166 passes current to the output line 152 through a circuit including the transistor 142 and the transistor 122. In this way, the output line 150 receives a current from two of the output members, corresponding to the analog value of "2".

The system shown in FIG. 3 and described above has all of the advantages described above for the system shown in FIG. 1. For example, capacitive effects are minimized because there are no cross-over of leads in the matrix arrangement defined by the control transistors 116 through 120 (even numbers only) and the transistors 130 through 144 (even numbers only) and by the connections of these transistors to the output members 160 through 166 (even numbers only). The control transistors may also be considered to be connected in subsets and in a pyramid relationship such as described above for the embodiment shown in FIG. 1.

The transistors in the embodiment of FIG. 3 may also be considered to be connected in a recursive relationship defined by a basic building block. This basic building block may be considered to be defined by the transistors 116, 118, 120 and 122 and by the transistors 130 through 144 (even numbers only). This building block may be considered as being formed by two (2) recursive sub-blocks. One of the recursive sub-blocks may be considered as being formed by the transistors 116 and 118 and the transistors 130, 132, 134 and 136 and the other may be considered as being formed by the transistors 120 and 122 and the transistors 138, 140, 142 and 144.

Figure 4:
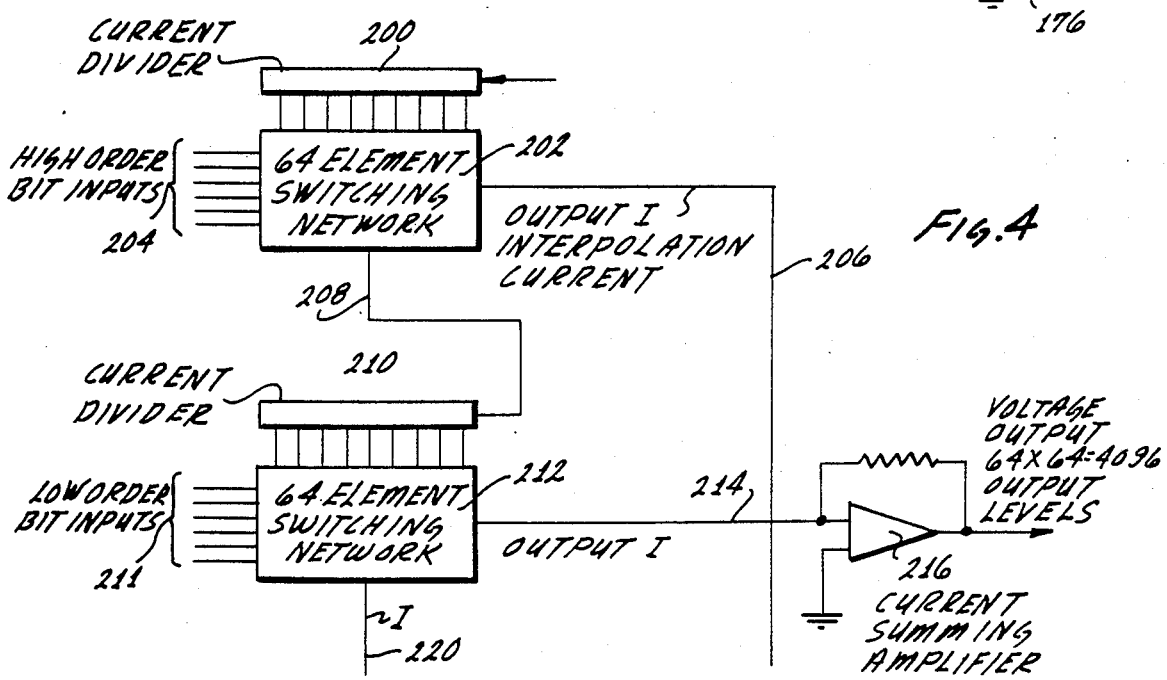
FIG. 4 is a block diagram of another embodiment of the invention, this embodiment illustrating the interconnection of more than one of the embodiments shown in FIG. 3.

FIG. 4 provides an arrangement for converting a considerable number of bits of digital information to a corresponding analog signal in a relatively simple manner. In the embodiment shown in FIG. 4, output members corresponding to the output members 60 through 74 (even numbers only) in FIG. 1 or the output members 160, 162, 164 and 166 in FIG. 3 are illustrated on a block basis at 200. The output members are connected in FIG. 4 to a block 202 corresponding to the matrix arrangement shown in FIG. 1 or the matrix arrangement shown in FIG. 3. This block may receive signals representing the binary digits of greatest significance. By way of illustration, these signals are introduced to input lines indicated at 204 in FIG. 4. Six (6) input lines are illustrated in FIG. 4. These input lines correspond to the input lines 12, 14 and 16 in FIG. 1 or the lines 112 and 114 in FIG. 34.

An output line 206 extends from the matrix arrangement 202 in FIG. 4. The output line 206 corresponds to the output line 82 in FIG. 1 or the output line 150 in FIG. 3. An interpolation line 208 also extends from the matrix arrangement 202 in FIG. 4. The interpolation line 208 corresponds to the line 84 in FIG. 1 or the line 154 in FIG. 3. The interpolation line 208 in FIG. 4 is connected to a block 210 corresponding to the block 200 in FIG. 4. The block 210 includes a plurality of output members such as is provided for the block 200. The output members are in turn connected to a matrix arrangement 212 corresponding to the matrix arrangement 202 in FIG. 4. The matrix arrangement 212 receives signals of decreased digital significance on lines 211 relative to the signals introduced on the lines 204.

An output line 214 extends from the matrix arrangement 212. The output line 214 corresponds to the output line 206 from the matrix arrangement 202. The output line 206 and 214 are connected to an amplifier 216 corresponding to the amplifier 172 in FIG. 3. The output voltage from the amplifier 216 indicates the analog value of the digital signals introduced through the lines 204 to the matrix arrangement 202 and the corresponding digital signals introduced to the matrix arrangement 212 through the lines 211.

An interpolation line 220 may extend from the matrix arrangement 212. The interpolation line 220 may correspond to the interpolation line 208 extending from the matrix arrangement 202. The interpolation line 220 may be connected to an additional block (not shown) corresponding to the blocks 200 and 210. In this way, the chain arrangement shown in FIG. 4 may be extended through any number of successive sequences that the user may desire. As will be appreciated, each extension of the chain increases the accuracy in which the digital information is converted to an analog voltage.

Figures 5, 6:
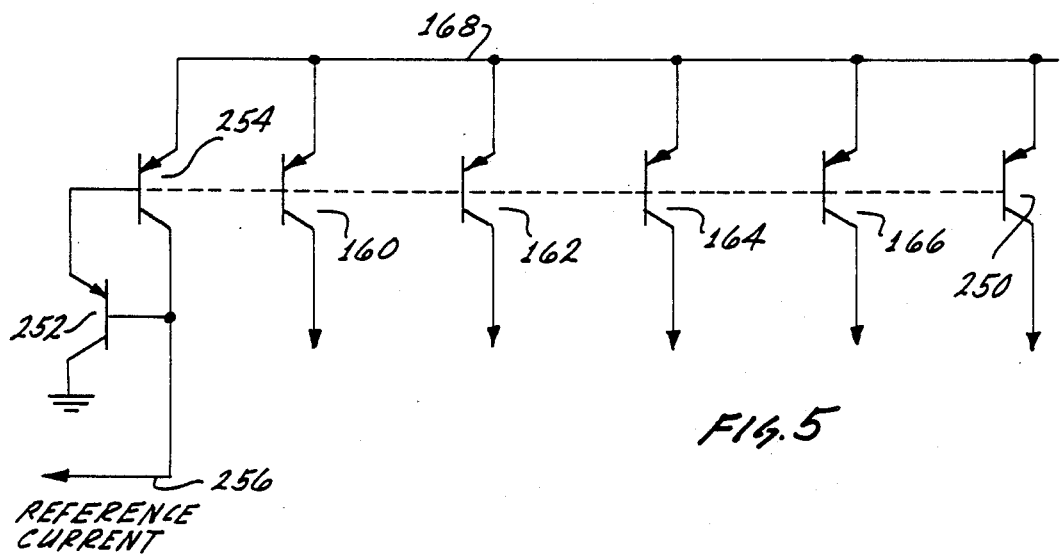
FIG. 5 is a schematic circuit diagram of a current generator capable of being used in the embodiment of FIG. 4.
FIG. 6 is a schematic diagram illustrating the disposition of different output members on an integrated circuit chip in one embodiment of the invention.

FIG. 5 illustrates a circuit for insuring that the output members such as the transistors 160, 162, 164 and 166 provide a current of a particular magnitude. The transistors 160, 162, 164 and 166 are shown in FIG. 5 as having their emitters connected to the line 168 in a manner similar to that shown in FIG. 3 and described above. A transistor 250 is also shown as having a similar connection. The transistor 250 may constitute the n−1)th transistor when there are (n−1) transistors in an arrangement corresponding to the block 202 in FIG. 4. The transistors 160, 162, 164 166 and 250 are shown in FIG. 4 as constituting pnp transistors.

The bases of the transistors 160 162, 164, 166 and 250 and the base of a reference transistor 254 in FIG. 5 are connected to the emitter of a transistor 252. The transistors 252 and 254 may also be pnp transistors having characteristics corresponding to the transistors 160, 162, 164 and 166. The base of the transistor 252 is common with the collector of the transistor 254 and with a line 256 providing a reference current. The collector of the transistor 252 may be connected to a reference potential such as ground. Connections are made from the collectors of the transistors 160, 162, 164, 166, 250 and 254 to the matrix arrangement 202 in FIG. 4.

A reference current is drawn from the line 168 through the transistor 254 to the line 256. This causes the base of the transistor 252 to receive a potential for making the transistor conductive. The flow of current through the transistor 252 establishes a potential on the transistor 254 for maintaining the flow of current through the transistor 254.

As the current through the transistor 254 increases, the potential on the collector of the transistor 254 decreases toward the ground potential on the collector of the transistor 252. This causes the current through the transistor 252 to increase and causes the transistor 252 to inject additional current into the base of the transistor 254. This action continues until virtually all of the reference current is conducted by the transistor 254.

The converters shown in FIGS. 1, 3, 4 and 5 and described above have other advantages in addition to those described above. For example, the matrix arrangement is constructed to receive directly the digital signals on the input lines such as the lines 12, 14 and 16 and to operate on such signals to provide, on the output line such as the output line 82, a current having an amplitude directly related to the analog value represented by the digital signals. In this way, the converter has a simple and straightforward construction and is still able to provide an accurate analog indication of a digital value.

By providing an arrangement in which all of the output members such as transistors are conductive and by switching progressive output members to an output line such as the line 150 in FIG. 3 as the digital value progressively increases, the monotonic operation of the converters shown in FIGS. 1, 3, 4 and 5 is assured. Furthermore, when the output members such as transistors are made with precision and when a considerable number of output members such as transistors are responsive to the operation of the matrix arrangements shown in FIGS. 1 and 3, the converters operate to provide minimal differential and integral non-linearities. The monotonic operation of the converter is further assured because all of the output members remain continuously conductive, whether they are connected to either one of the output lines such as the lines 150 and 152 in FIG. 3.

Since the output members such as transistors previously connected to the output line such as the line 150 continue to remain connected to this line and additional output transistors become connected to the output line 150 as the digital value progressively increases, no discontinuities are produced as the number being converted changes from a decimal value such as "511" to a decimal value such as "512" or from a decimal value such as "1023" to a decimal value such as "1024". This further assures that the converters of FIGS. 1, 3, 4 and 5 are monotonic.

The converters shown in FIGS. 1, 3, 4 and 5 and described above may be incorporated on an integrated circuit chip. This is particularly true in view of the simple and straightforward construction of the particular matrix arrangement such as the matrix arrangement 202 in FIG. 4. However, the amplifier arrangement, such as the amplfiers 172 and 176 in FIG. 2, probably will not be incorporated as part of the integrated circuitry on the chip.

Such incorporation of the converter on the chip may be provided by large-scale integration (LSI) or very large scale integration (VLSI) techniques. In this way, the apparatus may be self-contained. Furthermore, since all of the transistors are formed simultaneously and the chip is quite small, the transistors have substantially identical characteristics. This is particularly true since the chip has a surface area less than approximately one tenth inch (1/10") square. The simultaneous formation of the output devices on such a small chip tends to assure that the current on the output line, such as the output line 150 in FIG. 3, indicates accurately in analog form the digital information represented by the signals on the input lines such as the lines 12, 14 and 16 in FIG. 1 or the input lines 112 and 114 in FIG. 3.

When the output members are incorporated on an integrated circuit chip, they may have output errors. These errors may be correlated or uncorrelated. Correlated errors occur on a progressive basis at progressive positions on the chip. They may result from progressive changes in the characteristics of the semi-conductor material on the chip. They may also result from progressive changes in line width or layer thickness across the chip or progressive changes in doping or impurity gradients across the chip. Uncorrelated errors result from random errors. For example, the random errors may result from variations in the grain size of the semiconductor material on the chip, grain size of the photolithic plate or the photoresist or surface roughness or irregularities in the semi-conductor material or in the support for the semi-conductor material.

Correlated errors can greatly exceed the uncorrelated errors. For example, the output members may be capacitors as disclosed and claimed in application Ser. No. 553,041 filed by Henry S. Katzenstein on Nov. 19, 1983, for APPARATUS FOR CONVERTING DATA BETWEEN DIGITAL AND ANALOG VALUES. When the output members constitute capacitors, matching of the capacitors with errors of one tenth of one percent (0.1%) can be obtained between two (2) adjacent capacitors. However, matching between two capacitors near the opposite ends of a die may have errors of one percent (1%). For any particular semi-conductor parameter, the value specified by the manufacturer for matching of adjacent elements is indicative of the uncorrelated error. The value specified for the matching of elements far apart is indicative of the correlated error.

The correlated and uncorrelated errors in the output members contribute to errors in integral linearity in a segmented converter. By a "segmented converter" is meant a converter in which each output member is responsive to a particular digital value. For example, as will be seen in FIG. 1, each output member is connected to the output line 80 only for a particular digital value, and the output member then remains connected to the output line 80 for values progressively increasing above that digital value. This may be seen from FIG. 2 and from the above discussion with respect to FIG. 2.

This invention minimizes correlated errors on the different output members on an integrated circuit chip. The correlated errors are minimized by disposing the output members of progressive value on the integrated circuit chip so that the correlated errors tend to become offset as the output members are connected in sequence to the output line 80 with progressive increases in the digital value.

One example of a disposition of the output members, such as the transistors 160, 162, 164 and 166 in FIG. 3, on the integrated circuit chip to minimize correlated errors is shown in FIG. 6. In FIG. 6, the different numbers represent the digital significance of the different output members in the plurality. They have numbers between "0" and "63" to represent values of progressive numerical significance. These numbers have an ascending order corresponding to the sequence in which the output members are connected to the output line 80 for ascending values of digital significance.

FIG. 6 illustrates one possible disposition of the output members when digital signals having values of $2^0$ through $2^5$ are introduced to the converter. However, it will be appreciated that the concepts of this invention are applicable to converters having any desired number of digital inputs.

The placement of the output members in the embodiment of FIG. 6 has been chosen so that output members are connected in sequence to the output line in a particular geometrical pattern as the digital value increases. In this geometrical pattern, successive output members are disposed symmetrically in groups relative to the common centroid of the integrated circuit chip. In the embodiment of FIG. 6, each group constitutes four (4) output members although groups with different numbers than four (4) output members may also be chosen. In the embodiment shown in FIG. 6, by way of example, the output members numbered "16", "17", "18" and "19" may constitute one group and the output members numbered "24", "25", "26" and "27" may constitute another group. As will be seen, the output members numbered "16", "17", "18" and "19" are symmetrically disposed about the common centroid of the integrated circuit chip. This is also true of the output members numbered "24", "25", "26" and "27" and the output members in every other group.

The output members "16", "17", "18" and "19" constituting one group may be considered to be paired. As will be seen, the output members "16" and "17" may be considered to constitute one (1) pair and the output members "18" and "19" may be considered to constitute another pair. The output members "16" and "17" are diagonally disposed on opposite sides of the common centroid in the integrated circuit chip. In other words, the output member "17" is as far below and to the right of the common centroid as the output member "16" is above and to the left of the common centroid. This diagonal relationship is also true with respect to the output members "18" and "19". However, the vectorial relationship between the output members "18" and "19" is opposite to that of the vectorial relationship between the output members "16" and "17". In other words, the line from the output member "16" to the output member "17" is to the right whereas the line from the output member "18" to the output member "19" is to the left.

By disposing the output members "16", "17", "18" and "19" in the geometrical relationship discussed above, the correlated errors produced in these output members are minimized. For example, the correlated errors in the output members "16" and "17" are offset by their paired relationship. Similarly, the correlated errors in the output members "18" and "19" are offset by their paired relationship. This offset is enhanced by the symmetrical relationship of the output members "16", "17", "18" and "19" about the common centroid of the integrated circuit chip and the opposite vectorial relationship of the output members "16" and "17" with respect to the output members "18" and "19". Symmetrical relationships about the common centroid are also provided for the output members in each of the other groups.

As will be seen in FIG. 6, intermediate values in the range of digital values may be disposed near the common centroid in the symmetrical relationship. For example, the output members "32", "33", "34" and "35" in one group may be disposed directly adjacent the common centroid as shown in FIG. 6. Similarly, the output members "36", "37", "38" and "39" in another group may be disposed directly adjacent the output members "32", "33", "34" and "35" in the vertical direction, and the output members "28", "29", "30" and "31" in a third group may be disposed directly adjacent the output members "32", "33", "34" and "35" in the horizontal direction. The output members "24", "25", "26" and "27" in another group may be disposed relatively near the common centroid in the vertical direction and the output members "40", "41", "42"]and "43" may be disposed relatively near the common centroid in the horizontal direction. This tends to enhance linearity at mid-scale by disposing the output members in the mid-scale range near the common centroid. The horizontal and vertical directions in FIG. 6 may be considered as constituting a pair of co-ordinate axes.

In line manner, output members representing extreme values in the digital range may be disposed near the periphery of the integrated circuit chip. This may be seen from the disposition of the output members "0", "1", "2" and "3" and the output members "60" "61", "62" and "63" in FIG. 6. It may also be seen from the disposition of the output members "4", "5", "6" and "7" and the output members "56", "57", "58" and "59" in FIG. 6.

Tests have shown that attempts to dispose the output members to minimize uncorrelated errors have provided a mean integral error of 0.024i, where i is the ideal current through each of the output members. However, when the correlated error in minimized as discussed above and as shown in FIG. 6, a mean integral error of 0.0043i is obtained. This constitutes an improvement by a factor of more than 5.5 over a random layout of the output members to minimize uncorrelated errors.

The apparatus described above has certain important advantages in addition to the advantages described above. It provides a conversion between digital and analog values at a fast rate because the conversion results from the connection to an output line of output members each constituting a single current source. The conversion is also accurate because the control of the output signal is obtained by the operation of a plurality of control switches which are connected in a particular matrix arrangement to be instantaneously responsive to the digital signals introduced to the matrix arrangement. The conversion is accurate and reliable, particularly when the converter is disposed on an integrated circuit chip. This results from the fact that the chip is quite small and the chip has substantially uniform characteristics throughout its surface area. For example, the chip may have a surface area less than one tenth inch (1/10″) square. Furthermore, the accuracy of the conversion can be enhanced by disposing the control switches in each group in a spaced relationship throughout the surface area of the chip as shown in FIG. 6 and discussed in detail above.

The converter of this invention also has other advantages of some importance. For example, the converter is monotonic. This results from the fact that the conversion to analog form of digital signals of progressively increasing value is obtained by connecting an increased number of output members to a particular output line, while maintaining the connection to the particular output line of output members previously connected to the line. Furthermore, by connecting output members to the particular output line to convert digital information to an analog form, errors resulting from differential and integral non-linearities are minimized. This is particularly true when the output members are precision transistors, particularly transistors providing a precision flow of current as in FIG. 5, and when there are a considerable number of output members in the converter. It is also particularly true because the output members are conductive at all times.

The converters of this invention also have other advantages of some importance. For example, they introduce digital signals directly to a particular matrix arrangement without requiring that the digital signals be modified by decoders as in the prior art. Furthermore, the matrix arrangement is relatively simple and straightforward and operates to introduce current to an output line with a magnitude directly related to the analog value represented by the digital signals. The particular matrix arrangement is further advantageous because the paired relationship of the switches in the matrix arrangement causes substantially the same number of switches in the matrix relationship to be closed regardless of the digital value to be converted. Since substantially the same number of switches remains closed regardless of the digital values to be converted at any instant, the matrix arrangement has a balanced operation which contributes to the monoticity and to the integral and differential linearity of the converters of this invention. The balanced operation is enhanced because all of the output members are continuously conductive whether they be connected to either one of the output lines such as the line 150 or the line 152 in FIG. 3.

There are other important advantages to the converter of this invention. For example, the converter of this invention is quite small. This is particularly true when the converters of this invention are compared with converters which attempt to provide a comparable accuracy in the prior art. The converters of this invention are also quite inexpensive. This results in part from the production of the converter on a single chip.

The converter of this invention also offers the advantage of providing high output currents. This results from the fact that the amount of power delivered at the output line, such as the line 150 in FIG. 3, can be adjusted by varying the number and size of the control switches in each stage in the matrix relationship. For example, the output current can be doubled by doubling the number of switches in each stage. As a result of its ability to supply a large current, the converter of this invention can be considered to provide a current amplification at the same time that it provides a conversion. This is important in such applications as the conversion of aural information such as sound. The invention accordingly has a particular utility in the recently developed techniques of digital recording and reproduction of sound.

The apparatus of this invention is easily adaptable to provide for an addition of digits to increase its accuracy. This results in part from the modular construction of the apparatus such as shown in FIG. 4 and the repetitive nature of the matrix arrangement. The apparatus also maintains its accuracy as its ages. The apparatus maintains its accuracy as it ages because the integrated circuit chip is essentially homogeneous in construction and any non-linearities are cancelled by a physical layout such as shown in FIG. 6 and discussed above. As a result, all of the switches on the chip age in substantially identical relationships. The disposition of the different switches in spaced relationship on the chip also facilitates an aging in which the accuracy is maintained.

The converter is also substantially free of the effects of temperature for substantially the same reasons as discussed above with respect to aging. Such avoidance in the chip of the effects of temperature variations also results from the fact that the distribution of the switches in each group throughout the surface area of the chip prevents the temperature of the chip from becoming excessive at any localized areas.

The converter of this invention also has another advantage of some significance. In the particular matrix relationship shown in FIGS. 1 and 3, the width of the switches for each digit can be varied inversely to its numerical significance. For example, the switches 24 and 26 in FIG. 1 can be made wider than the switches 30, 32, 34 and 36. This increases the accuracy in the conversion between digital and analog values.

As will be seen, the matrix relationship provides only a single time delay. The term "time delay" may be considered as that time required for a switch to open or close. The "single time delay" results from the fact that all of the switches providing the decoding and further providing the matrix relationship open or close simultaneously.

Although this application has been disclosed and illustrated with reference to particular applications, the principles involved are susceptible of numerous other applications which will be apparent to persons skilled in the art. The invention is, therefore, to be limited only as indicated by the scope of the appended claims.

I claim:

1. In combination for providing a conversion between binary-coded and analog values, an integrated circuit chip having a common centroid, means for providing a plurality of binary signals each having first and second logic levels respectively coding for binary "1" and binary "0" and each having an individually weighted binary significance, the binary signals cumulatively representing the analog value, a plurality of control switches disposed on the integrated circuit chip, each of the control switches having conductive and non-conductive states, each of the control switches being operatively coupled to an individual one of the signal means to become operative in a particular one of the conductive and non-conductive states in accordance with the logic levels of the signals from the associated signal means, a plurality of output members disposed on the integrated circuit chip, each of the output members having a conductive state, a line, means disposed on the integrated circuit chip and connecting the plurality of control switches in a particular matrix relationship to the output member and to the line to provide for the connection of progressive ones of the output members to the line in accordance with the pattern of the control switches in the conductive and non-conductive states in representation of progressive increments in the analog value coded by the logic levels of the binary signals and to provide, with such progressive increments in such analog value, for the continued coupling to the line of the output members previously connected to the line, each of the output members in the plurality being connected in the matrix relationship to code for an analog increment different from the analog increments coded by the other output elements in the plurality, and means for providing for a flow of a particular current through each of the output members connected to the line, the output members being disposed on the integrated circuit chip in groups, each of the output members in each group having a progressive binary significance, the output members in each group being disposed in a symmetrical arrangement relative to the common centroid of the integrated circuit chip, the output members in the middle range of the analog values coded by the logic levels of the binary signals being disposed on the integrated circuit chip closer to the common centroid than the output members in the extreme ranges of such analog values.

2. The combination set forth in claim 1 wherein the control switches in the plurality are paired to provided for the conductivity of only one switch in each pair at each instant and to provide for the selection of the switch for conductivity in each pair in accordance with the logic levels of the binary signal introduced to such pair of switches and wherein the pattern of the conductive switches in the pair controls the connection of the output members to the line and wherein the output members are connected to the matrix relationship to provide at each instant for the connection to the line of a number of output members directly proportional to the analog value coded by the logic levels of the binary signals and wherein the output members in each group are disposed on the integrated circuit chip in a symmetrical relationship to minimize correlation errors by offsetting the linearity errors in the output members within that group.

3. The combination set forth in claim 1 wherein the switches in the plurality are disposed electrically in sub-sets each having a number of switches related to the binary significance of such switches in the particular matrix relationship and the switches in each sub-set are connected in the particular matrix relationship with the switches in the other sub-sets to pass current through the switches in accordance with the analog value coded by the logic levels of the binary signals and each of the switches in the plurality is connected in the matrix relationship to be responsive to the logic levels of the binary signals of associated binary significance and wherein the output members in each group are disposed in the symmetrical relationship on the integrated circuit chip in pairs of progressive binary significance to minimize the correlation errors between the output members in each pair and wherein the output members in the pairs in each group have a symmetrical diagonal relationship on the integrated circuit chip relative to the common centroid.

4. The combination set forth in claim 3 wherein the switches in each subset are connected to the switches in the subsets of next highest and lowest binary significance in the same relationship as the connections between the switches in every other sub-set and the switches in the subsets of next highest and lowest significance relative to such other subset.

5. The combination set forth in claim 1 wherein the integrated circuit chip has first and second coordinate axes and the output members in the group of a first binary significance have the same disposition on the integrated circuit chip relative to the first axis as the disposition on the integrated circuit chip of the output members in the group of the next highest binary significance relative to the second axis.

6. The combination set forth in claim 4 wherein the output members in each group are disposed in the symmetrical relationship in pairs of progressive binary significance to minimize the correlation errors between the output members in each pair and wherein the output members in each pair have a symmetrical diagonal relationship on the integrated circuit chip with respect to the common centroid and an opposite diagonal relationship on the integrated circuit chip relative to the output members in the other pair in that group.

7. In combination for providing a conversion between binary-coded and analog values, an integrated circuit chip, means for providing a plurality of binary signals each having logic levels respectively coding for binary "1" and binary "0" and representing a binary value of individual binary significance, the logic levels of the binary signals cumulatively representing the analog value, a plurality of switches disposed on the integrated circuit chip, the switches in the plurality being disposed in sub-sets, the switches in a first one of the sub-sets having conductive and non-conductive states and being connected in paired relationship with another individual one of the switches in the first sub-set to provide at each instant for the conductivity of only one of the switches in each such pair, the switches in a second one of the sub-sets having conductve and non-conductive states and being connected in a paired relationship with another individual one of the switches in the second sub-set to provide at each instant for the conductivity of only one of the switches in each such pair, a plurality of output members disposed on the integrated circuit chip, means connected to the plurality of output members to obtain a flow of current through the output members, means for introducing the binary signals of higher binary value to the switches in the first sub-set to obtain a conductivity of a particular switch in each pair in the first sub-set in accordance with the logic levels of such binary signals, means for introducing the binary signals of lower digital value to the switches in the second sub-set to obtain a conductivity of a particular switch in each pair in the second sub-set in accordance with the logic levels of such binary signals, first and second lines, and means disposed on the integrated circuit chip for connecting the switches in the first and second sub-sets to the output members and to the lines in a particular matrix relationship to provide for a continued connection through the matrix relationship to the first line of output members previously connected to the first line with progressively increasing analog values coded by the logic levels of the binary signals and to provide for a connection through the matrix relationship to the first line of additional output members in the plurality with such progressive increases in such analog value and in accordance with the particular pattern of operation of the switches in the first and second sub-sets in the conductive and non-conductive states, each of the output members in the plurality being connected in the matrix relationship to code for an incremental analog value different from the incremental analog values coded by the other output members in the plurality, the integrated circuit chip having a common centroid, the output members in the plurality being disposed on the integrated circuit chip to define successive groups, each group providing for an indication of progressive analog values in accordance with the connection of the members of that group to the first line and to define, for each successive group of output members to be activated for progressively increasing analog values, a symmetrical relationship with respect to the common centroid of the integrated circuit chip, the output members in the plurality being disposed on the integrated circuit chip such that the output members coding for the intermediate range of incremental analog values are disposed at first positions on the integrated circuit chip relative to the common centroid of the integrated circuit chip and the output members coding for progressive values toward the opposite extremes of the incremental analog values are disposed on the integrated circuit chip in progressively displaced relationship from the first positions on the integrated circuit chip.

8. The combination set forth in claim 7, including, a third line, the third line being connected at each instant in the matrix relationship to the next one of the output members in the plurality to be connected to the first line with progressive increases in the analog value coded by the logic levels of the binary signals, the second line being connected to the output members not connected in the plurality to the first and third lines, the output members in the groups coding for intermediate values in the range of analog values being disposed in the symmetrical relationship near the common centroid of the integrated circuit chip and the output members in the groups coding for progressive values toward the opposite extremes of the analog values being disposed on the integrated circuit chip in progressively displaced relationship from the common centroid on the integrated circuit chip.

9. The combination set forth in claim 7, including, the first and second sub-sets of switches being connected in the particular matrix relationship to define circuits each including individual ones of the switches in the first and second sub-sets in the conductive state in accordance with the logic levels of the binary signals of higher and lower binary values, the first and second sub-sets of switches being disposed electrically to be responsive only to the logic levels of the associated one of the binary signals, and progressive pairs of the output members in each group being disposed on the integrated circuit chip in a symmetrical diagonal relationship with respect to the common centroid of the integrated circuit chip.

10. The combination set forth in claim 8, including, the plurality of switches being of solid state construction, means, including the matrix relationship defined by the first and second sub-sets of switches, operatively coupled to the output members for providing for a substantially equal flow of current through the individual output members with the operation of the switches in the first and second sub-sets in the different patterns of the conductive and non-conductive states representative of the different analog values, there being four (4) output members in each group, the output members in each group constituting first and second progressive pairs, the output members in the first pair in each group being disposed vectorially in an opposite, but symmetrical, diametrical relationship with respect to the output members in the second pair in that group.

11. The combination set forth in claim 10 wherein the output members in each pair in each group have progressive analog significances.

12. In combination for converting between binary-coded and analog values, an integrated circuit chip, means for providing binary input signals of individual binary significance, each of the binary signals having first and second logic levels respectively coding for a binary "1" and a binary "0", the binary signals cumulatively coding for the analog value, first, second and third sub-sets of control switches disposed on the integrated circuit chip, the control switches in each sub-set having conductive and non-conductive states, the control switches in each sub-set having a binary significance related to the binary significance of the binary signals controlling the conductivity of the switches in that sub-set, means disposed on the integrated circuit chip and connecting the control switches in the first, second and third sub-sets in a matrix relationship in accordance with the logic levels of the binary signals introduced to such sub-set, a plurality of output members disposed on the integrated circuit chip, a pair of lines disposed on the integrated circuit chip, and means disposed on the integrated circuit chip and connecting the control switches in the first, second and third sub-sets to the output members to obtain a progressive coupling of the output members to the first line with progressively increasing incremental values coded by the logic levels of the binary signals and to obtain a progressive coupling of the output members in the plurality to the second line with progressively decreasing incremental values coded by the logic levels of the binary signals, esch of the output members in the plurality being connected to the control switches in the first, second and third sub-sets to code for an incremental analog value different from the incremental analog values coded by the other output members in the plurality, the output members being disposed on the integrated circuit chip in groups having a common centroid arrangement on the integrated circuit chip to offset correlated errors in the output members in the group, each of the output members in each group having a particular disposition on the integrated circuit chip relative to the common centroid in accordance with the progressive incremental analog value coded by such output member.

13. The combination set forth in claim 12, including, the matrix relationship of the control switches in the first, second and third sub-sets being recursive and the recursive relationship being defined by first and second recursive sub-relationships symmetrically connected to each other and defined by a particular number of control switches in one of the sub-sets of reduced binary significance and an increased number of control switches in one of the sub-sets of increased binary significance, the first recursive sub-relationship being connected to the first line and the second recursive sub-relationship being connected to the second line, the output members in each group being disposed on the integrated circuit chip in pairs to offset the correlation errors in such output members and the output members in successive pairs in each group being disposed on the integrated circuit chip to offset correlation errors relative to each other.

14. The combination set forth in claim 12, including, a third line,
the first and second recursive sub-relationships having a common connection to the third line,
the output members in each group being provided with progressive analog significances in the range of analog values.

15. The combination set forth in claim 12, including, the output members in each group being provided with progressive analog significances in the range of analog values,
the output members in each group being disposed on the integrated circuit chip in pairs relative to the common centroid to provide offsets in the correlation errors in the output members in each pair,
the control switches in the first sub-set having the same connections to the control switches in the second sub-set as the control switches in the second sub-set have to the control switches in the third sub-set.

16. The combination set forth in claim 12, including, the output members in the groups having intermediate analog values in the range of analog values being disposed on the integrated circuit chip in positions providing minimal correlation errors relative to the common centroid position.

17. The combination set forth in claim 16 wherein the output members in the groups having progressive deviations from the intermediate analog values being disposed on the integrated circuit chip in positions providing progressive correlation errors relative to the common centroid position.

18. In combination for converting between binary-coded and analog values,
an integrated circuit chip having a common centroid,
means for providing binary signals cumulatively coding for the analog value and individually coding for binary values of individually weighted binary significance and having first and second logic levels respectively coding for binary values of "1" and "0",
a plurality of control switches each having conductive and non-conductive states and each disposed on the integrated circuit chip, the control switches being arranged in sub-sets each responsive to an individual one of the binary signals to provide an operation of the control switches in that sub-set in the conductive and non-conductive states in accordance with the logic levels of the binary signals introduced to such sub-set,
a line,
a plurality of output members disposed on the integrated circuit chip, and
means disposed on the integrated circuit chip and cooperative with the control switches in the conductive states of the control switches for providing a controlled connection of the output members in the plurality to the line in accordance with the operation of the controlled switches in the conductive states, each of the output members in the plurality being connected to the output line upon the occurrence of an incremental analog value different from the incremental analog values in which the other output members in the plurality are connected to the output line,
the output members in the plurality being disposed on the integrated circuit chip in groups such that the output members in the progressive groups, in the order of their progresive analog significance relative to a median analog value, are progressively spaced relative to the common centroid of the integrated circuit chip.

19. The combination set forth in claim 18, including, the integrated circuit chip being provided with first and second axes and the output members in the plurality being disposed on the integrated circuit chip such that the output members in the progressive groups are progressively displaced from the common centroid of the integrated circuit chip in the order of their progressive deviation from the median analog value and first ones of the progressive groups have the same deviation along a first one of the axes from the common centroid as the deviations of the next ones of the progressive groups from the common centroid along the other axis.

20. The combination set forth in claim 19, including, the output members in each group being disposed in pairs and the output members in each pair having a diagonal relationship with respect to the first and second axes and the diagonal relationship of the output members in each pair in each group being opposite to the diagonal relationship of the output members in the other pair in that group.

21. The combination set forth in claim 20 wherein the output members having an analog significance of median value are disposed close to the common centroid.

22. In combination for providing a conversion between binary-coded and analog values,
an integrated circuit chip,
means for providing a plurality of binary signals coding for individual binary values of different weighted binary significance, each of the binary signals having first and second logic levels coding for binary "1" and binary "0", the binary signals in the plurality coding for the analog value, sub-sets of control switches disposed on the integrated circuit chip, the switches in each sub-set coding for an individual one of the binary values, the number of control switches in each sub-set being related to the binary significance of the control switches in such sub-set, means for introducing the logic levels of the binary signals to the individual sub-sets of control switches of corresponding binary significance to provide for the conductivity of the control switches in each sub-set in accordance with the binary value coded by the logic levels of the signals introduced to the control switches in that sub-set, a plurality of output members disposed on the integrated circuit chip, each output member in the plurality being constructed to provide a current of a particular value, means for providing for the flow of the currents of the particular value through the output members, a line, means disposed on the integrated circuit chip and connecting the sub-sets of control switches to the output members and the line in a particular matrix relationship to provide paths between the output members and the line through the conductive ones of the control switches to obtain, with progressive incremental increases in the analog value coded by the logic levels of the binary signals, progressive incremental increases in the number of the output members connected to the line and to retain, with such progressive incremental increases in such analog value, the connection between the line and the output members previously connected to the line, each of the output members in the plurality being connected in the matrix relationship to become connected to the output line for an incremental increase in the analog value different from the incremental increase coded in the analog value by the other output members in the plurality, the integrated circuit chip having a common centroid, the output members in the plurality being disposed on the integrated circuit chip in groups, the output members in each group being provided with a symmetrical disposition on the integrated circuit chip relative to the common centroid in the integrated circuit chip, the output members in the groups coding for a median analog value being disposed relative to the common centroid to provide minimal correlated errors.

23. The combination set forth in claim 22, including, the output members in the groups coding for progressive deviations from the median analog value being disposed on the integrated circuit chip relative to the common centroid to provide correlated errors of progressively increasing magnitude.

24. The combination set forth in claim 23 wherein each group consists of four output members substantially equally spaced on the integrated circuit chip from the common centroid and disposed in pairs, the integrated circuit chip having first and second axes and the output members in each pair having a diagonal relationship to the first and second axes.

25. The combination set forth in claim 24 wherein the diagonal relationship of the output members in a first one of the pairs in each group is opposite to the diagonal relationship of the output members in the other pair in that group.

26. In combination for converting between binary coded values and analog values, means for providing a plurality of binary signals each having first and second binary values respectively coding for binary values of "1" and "0" and each having an individually weighted binary significance, the binary signals cumulatively coding for the analog value, means for decoding the binary signals, means including a plurality of output means responsive to the signals from the decoding means to produce output signals having progressive increments of equal magnitude in the analog value, each of the increments being coded by an individual one of the output members in the plurality, an integrated circuit chip having a common centroid, and the binary signal means, the decoding means and the output means in the plurality being disposed on the integrated circuit chip, the output means in the plurality being disposed on the integrated circuit chip in groups representative of progressive increments of equal magnitude in the analog value, the output means in each group being disposed on the integrated circuit chip in symmetrical relationship with respect to the common centroid, the individual groups of output means having a progressive correlated error dependent upon their relative deviation from a coding for a particular analog value.

27. In a combination as set forth in claim 26, the groups of output means being disposed on the integrated circuit chip to provide progressive correlated errors with progressive deviations from the coding for the particular analog value.

28. In a combination as set forth in claim 26, the output means in each group being disposed on the integrated circuit chip in pairs, the output means in each pair in each group having a diagonal relationship on the integrated circuit chip with respect to the output means in the other pair in such group.

29. In a combination as set forth in claim 28, the groups of output means being disposed on the integrated circuit chip to provide progressive correlated errors with progressive deviations from the coding for the particular analog value and the particular analog value constituting a median value.

30. In a combination as set forth in claim 26, the integrated circuit chip having first and second axes and the output means in the groups of first analog significance being closer on the integrated circuit chip to the first axis than the second axis in a particular relationship and the output means in the groups of next highest analog significance being closer on the integrated circuit chip to the second axis than the first axis in the particular relationship.

* * * * *